(12) United States Patent
Ali (10) Patent No.: US 12,155,997 B2
(45) Date of Patent: Nov. 26, 2024

(54) MEMS OPTICAL MICROPHONE

(71) Applicant: AAC ACOUSTIC TECHNOLOGIES (SHENZHEN) CO., LTD., Shenzhen (CN)

(72) Inventor: Taimoor Ali, London (GB)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 148 days.

(21) Appl. No.: 17/952,340

(22) Filed: Sep. 26, 2022

(65) Prior Publication Data

US 2024/0107239 A1    Mar. 28, 2024

(51) Int. Cl.
| | | |
|---|---|---|
| *H04R 23/00* | (2006.01) | |
| *B81B 3/00* | (2006.01) | |
| *G02B 6/12* | (2006.01) | |
| *H04R 3/00* | (2006.01) | |
| *H04R 7/04* | (2006.01) | |
| *H04R 7/18* | (2006.01) | |
| *H04R 19/04* | (2006.01) | |

(52) U.S. Cl.
CPC ......... *H04R 23/008* (2013.01); *B81B 3/0083* (2013.01); *G02B 6/12004* (2013.01); *H04R 3/00* (2013.01); *H04R 7/04* (2013.01); *H04R 7/18* (2013.01); *H04R 19/04* (2013.01); *B81B 2201/0257* (2013.01); *B81B 2203/0127* (2013.01); *H04R 2201/003* (2013.01)

(58) Field of Classification Search
CPC .......... H04R 23/008; H04R 3/00; H04R 7/04; H04R 7/18; H04R 19/04; H04R 23/00; B81B 3/0083; G02B 6/12004
See application file for complete search history.

(56) References Cited

U.S. PATENT DOCUMENTS

| | | | |
|---|---|---|---|
| 7,355,720 B1 * | 4/2008 | Carr ..................... | H04R 23/008 356/498 |
| 11,320,718 B1 * | 5/2022 | Mahmoud ............ | G02B 6/3596 |
| 2003/0128958 A1 * | 7/2003 | Paritsky ............... | H04R 23/008 385/901 |

(Continued)

FOREIGN PATENT DOCUMENTS

WO    WO-02089523 A1 * 11/2002 .......... H04R 23/008

*Primary Examiner* — Olisa Anwah
(74) *Attorney, Agent, or Firm* — W&G Law Group (57) ABSTRACT

An MEMS optical microphone, including: a case, a membrane, a waveguide plate, a variable optical waveplate, an optoelectronic module, and an IC module. The case includes a cavity and a sound inlet. The membrane is suspended in the cavity and closes the sound inlet. The waveguide plate is suspended in the cavity and located at a side of the membrane away from the sound inlet. The optoelectronic module includes an electromagnetic radiation source and a sensing part provided at two opposite sides of the waveguide plate, respectively. The variable optical waveplate is configured to convert an input polarization state of the first light path into an output polarization state, which varies as a moving distance of the variable optical waveplate. The IC module is electrically connected to the membrane and the optoelectronic module. It has advantages such as high sensitivity, flat frequency response, thereby further improving the device performance.

9 Claims, 6 Drawing Sheets

(56) References Cited

U.S. PATENT DOCUMENTS

| | | | |
|---|---|---|---|
| 2004/0252930 A1* | 12/2004 | Gorelik | H04R 23/008 385/12 |
| 2005/0052724 A1* | 3/2005 | Suzuki | G01H 9/00 359/305 |
| 2005/0105098 A1* | 5/2005 | Johansen | G01L 9/0079 356/506 |
| 2013/0230329 A1* | 9/2013 | Sangawa | H04R 23/008 398/133 |
| 2013/0308957 A1* | 11/2013 | Iwamoto | H04R 23/008 398/133 |
| 2018/0208454 A1* | 7/2018 | Hoekstra | H04R 23/008 |
| 2019/0047848 A1* | 2/2019 | Hoekstra | H04R 23/008 |
| 2021/0108978 A1* | 4/2021 | Hofrichter | G01L 9/0076 |
| 2021/0258700 A1* | 8/2021 | Kervran | G02B 26/0825 |
| 2022/0201403 A1* | 6/2022 | Khaleghimeybodi | G01B 9/02083 |

\* cited by examiner

MEMS OPTICAL MICROPHONE

TECHNICAL FIELD

The present invention relates to the technical field of microphones, in particular to an MEMS optical microphone.

BACKGROUND

Conventional microphones are based on a capacitor, where the membrane vibrates with sound waves and a voltage change is generated by changing a distance between substrates of the capacitor, thereby achieving acoustic-electrical conversion.

The optical microphone is a relatively new type of microphone. The optical microphone usually includes three major modules, i.e., an optoelectronic module, an application specific integrated circuit module (IC module), and a microelectromechanical module (MEMS module). The optoelectronic module can emit light toward the micro-electromechanical module and receive light reflected by the microelectromechanical module. When sound waves actuate the membrane of the MEMS module, the membrane slightly vibrates to change the intensity and phase of the light reflected to the optoelectronic module. The photoelectric module converts the intensity and phase signals of the reflected light into electrical signals, and sends the electrical signals to the IC module, thereby realizing conversion from acoustic signals to optical signals and then to electrical signals.

As consumers have higher and higher experience requirements on the microphone, there is a need to provide an MEMS optical microphone with better performance.

SUMMARY

The present invention provides an MEMS optical microphone, aiming to solve the technical problems in the related art.

An embodiment of the present invention provides an MEMS optical microphone, including: a case, a membrane, a waveguide plate, a variable optical waveplate, an optoelectronic module, and an IC module. The case includes a cavity and a sound inlet that communicates the cavity to outside. The membrane is suspended in the cavity and closes the sound inlet. The waveguide plate is suspended in the cavity and located at a side of the membrane away from the sound inlet. A through-hole passes through the waveguide plate, and an input waveguide and an output waveguide are provided at two opposite sides of the through-hole, respectively. The variable optical waveplate is provided between the membrane and the waveguide plate. The variable optical waveplate includes a first end connected to a surface of the membrane facing away from the sound inlet, and a second end extends into the through-hole; and the variable optical waveplate moves back and forth along a first direction along as the membrane vibrates and deforms. The optoelectronic module includes an electromagnetic radiation source and a sensing part that are provided at two opposite sides of the waveguide plate, respectively. A first light path emitted from the electromagnetic radiation source is coupled into the waveguide plate; the first light path enters the sensing part after sequentially passing through the input waveguide, the variable optical waveplate and the output waveguide; and the variable optical waveplate is configured to convert an input polarization state of the first light path into an output polarization state, which varies as a moving distance of the variable optical waveplate along the first direction. The IC module is electrically connected to the membrane and the optoelectronic module.

As an improvement, the variable optical waveplate includes a birefringent crystal with different refractive indices in different directions.

As an improvement, a structure of the birefringent crystal is of a wedge shape or a cone shape.

As an improvement, the birefringent crystal includes mesoporous or porous silicon or a compound thereof formed by etching.

As an improvement, the output polarization state is one of a linear polarization state, an elliptical polarization state or a circular polarization state.

As an improvement, a reference guide is provided on the waveguide plate, and a second light path emitted from the electromagnetic radiation source enters the sensing part through the reference guide.

As an improvement, a beam emitted from the electromagnetic radiation source is divided into the first light path and the second light path, two sensing parts are provided, and the first light path and the second light path enter the two sensing parts, respectively.

As an improvement, the sensing part includes a polarizer and a photodiode, and the photodiode is located at a side of the polarizer away from the electromagnetic radiation source.

As an improvement, a lens is provided at a side of the input waveguide adjacent to the through-hole, and another lens is provided at a side of the output waveguide adjacent to the through-hole.

As an improvement, the membrane is of a shape that is a central symmetrical graphic, and the waveguide plate is arranged at a geometric center of the membrane.

Compared with the technical scheme in the related art, the present invention provides a variable optical waveplate arranged at a surface of the membrane, and when a pressure or sound signal is applied to the membrane to cause it vibrate, the variable optical waveplate attached to the membrane will also move from its original position along a first direction. The first light path emitted from the electromagnetic radiation source enters the variable optical waveplate through the input waveguide, and after leaving the variable optical waveplate, the input polarization state of the first light path is converted into a new output polarization state. Here, a state of the output polarization state varies as the displacement of the variable optical waveplate. The first light path with varying output polarization state is coupled to the output waveguide, and transmitted to the sensing part to generate a corresponding optical signal, and finally determines a level of the applied pressure or sound signal on the IC module, which has advantages such as high sensitivity, flat frequency response, thereby offering the potential to further improve the device performance.

REFERENCE NUMERALS 10 case;
11 sound inlet;
12 first wall;
13 second wall;
14 side wall;
15 cavity;
20 membrane;
30 waveguide plate;
31 through-hole;
32 input waveguide;
33 output waveguide;
34 reference guide;
35 lens;
40 variable optical waveplate;
50 electromagnetic radiation source;
51 polarizer;
52 photodiode;
53 first light path;
54 second light path;
60 IC module;
70 input polarization state;
80 output polarization state.

DESCRIPTION OF EMBODIMENTS

The embodiments described below with reference to the accompanying drawings are exemplary and are merely used to explain the present invention, but not intended to constitute a limitation on the present invention.

With reference to FIG. 1 to FIG. 4, an embodiment of the present invention provides an MEMS optical microphone, including a case 10, a membrane 20, a waveguide plate 30, a variable optical waveplate 40 and an optoelectronic module.

Figure 1:
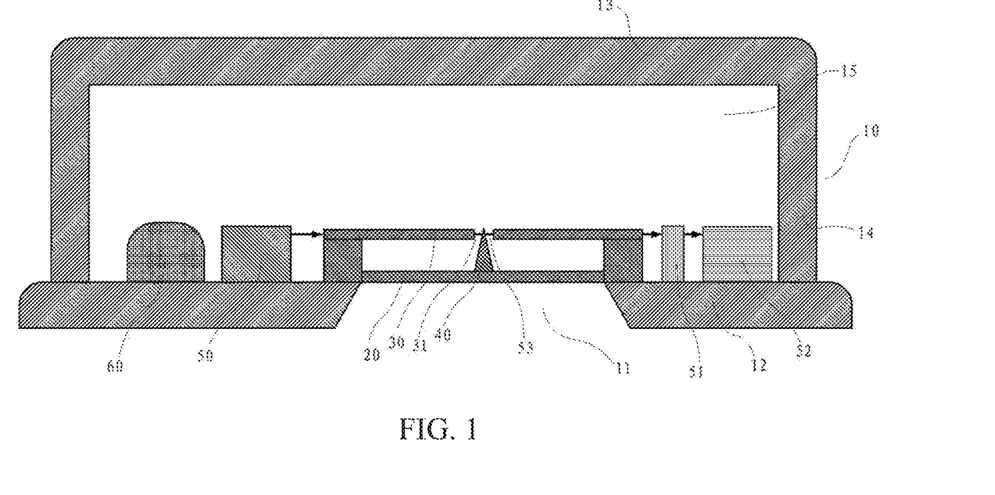
FIG. 1 is a schematic structural diagram of an MEMS optical microphone in an initial state according to a first embodiment of the present invention.

In an embodiment of the present invention, the case 10 includes a cavity 15 and a sound inlet 11 that communicates the cavity 15 with the outside. The cavity 15 includes a first wall 12, a second wall 13 and a side wall 14 connecting the first wall 12 and the second wall 13. The first wall 12 is opposite to the second wall 13. The first wall 12 is a PCB substrate. The membrane 20, the optoelectronic module, the IC module 60 and the sound inlet 11 are all arranged at the first wall 12. It should be noted that the side wall 14 may be integrally formed as a part of the first wall 12 or the second wall 13, or may be an independent part.

The membrane 20 is suspended in the cavity 15 and closes the sound inlet 11. The sound wave enters the case 10 through the sound inlet 11 and actuates vibration of the membrane 20. In a case that the membrane 20 vibrates, the membrane 20 moves up (or moves down, depending on a type of the microphone) and moves down (or moves up, depending on a type of the microphone), which is like a standard vibration/oscillation structure, with a specific frequency and a specific displacement. The frequency depends on a frequency of the sound wave, and the displacement depends on a pressure of the sound wave.

The waveguide plate 30 is suspended in the cavity 15 and is located at a side of the membrane 20 away from the sound inlet 11. In an implementation manner, a support arm is further provided, and two opposite ends of the support arm are respectively connected to the waveguide plate 30 and the first wall 12, to suspend the waveguide plate 30 in the cavity 15. The waveguide plate 30 is a plate that has an optical path for transmitting light and is placed parallel to the MEMS membrane. A through-hole 31 running through the waveguide plate 30 is formed for allowing the variable optical waveplate to pass through. The waveguide plate 30 is a polarization maintaining waveguide that does not affect a polarization state of the light during light transmission. The waveguide plate 30 is provided with an input waveguide 32 and an output waveguide 33 that are located at two opposite sides of the through-hole 31.

The variable optical waveplate 40 is arranged between the membrane 20 and the waveguide plate 30. A first end of the variable optical waveplate 40 is connected to a surface of the membrane 20 facing away from the sound inlet 11, and a second end of the variable optical waveplate 40 extends into the through-hole 31. As the membrane 20 vibrates and deforms, the variable optical waveplate 40 can move back and forth along a first direction. In the embodiments provided by the present invention, the first direction is a direction parallel to a Z axis in a coordinate system shown in the figure. When the membrane 20 vibrates in the Z-axis or vertical direction due to an external sound signal, the variable optical waveplate 40 moves, and the displacement of the movement is proportional to an amplitude of the vibration of the membrane 20.

The variable optical waveplate 40 is an optical element that can change the polarization state of the light passing therethrough. In order to convert a given input polarization state 70 of the light to an arbitrary output polarization state 80, it can be achieved by providing materials or structures with variable delays. These involve the birefringence of the material and the optical path length or thickness of the optical structure. The optical material used in the variable optical waveplate 40 adds a phase delay between the orthogonal components of an electric field of light at a fixed wavelength. For example, a quarter-waveplate converts a linear input polarization state 70 to a circular polarization state and vice-versa.

The optoelectronic module includes an electromagnetic radiation source 50 and a sensing part. The electromagnetic radiation source 50 and the sensing part are respectively arranged at two opposite sides of the waveguide plate 30. The electromagnetic radiation source 50 includes, for example, an infrared (IR), visible light or UV source, which may be a laser or a light-emitting diode. The sensing part includes a polarizer 51 and a photodiode 52. The photodiode 52 is located at a side of the polarizer 51 away from the electromagnetic radiation source 50.

A first light path 53 emitted from the electromagnetic radiation source 50 is coupled into the waveguide plate 30. The light coupling can be achieved in various ways such as using an optical fiber that directly couples the light with edge or butt coupling or incorporates a grating coupler to transmit the light to the input waveguide 32. The first light path 53 enters the sensing part after sequentially passing through the input waveguide 32, the variable optical waveplate 40 and the output waveguide 33. Since the input waveguide 32 is a polarization maintaining waveguide, an input polarization state 70 of the first light path 53 remains its polarization state when passing through it. The first light path 53 leaves the input waveguide 32 at the through-hole 31 and is transmitted through the variable optical waveplate 40 before it is again coupled to the output waveguide 33 and finally transmitted to the photodiode 52 through the polarizer 51.

The variable optical waveplate 40 is configured to convert a fixed input polarization state 70 of the first light path 53 to various output polarization states 80. The output polarization state 80 varies as a moving distance of the variable optical waveplate 40 along the first direction changes. When the first light path 53 passes through the polarizer 51, a level of the light intensity changes. The level of light intensity depends on a specific state of the output polarization state 80 of the light. At the photodiode 52, the outputted polarized light intensity is converted into an electrical signal that is processed at the IC module 60 and determines the level of the applied sound signal.

The IC module 60 is electrically connected to the membrane 20 and the optoelectronic module. The IC module 60 (ASIC) includes an electronic circuit that constitutes a control or central processing unit, and is configured to drive, control and take necessary actions for the related electronic and optoelectronics in the system.

Based on the above embodiments, a working principle of the present invention is as follows.

Figure 2:
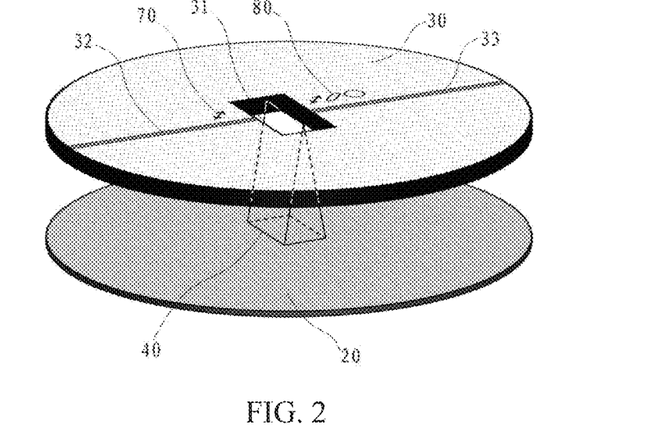
FIG. 2 is a first schematic diagram illustrating cooperation between a variable optical waveplate and a waveguide plate of the MEMS optical microphone in an initial state according to the first embodiment of the present invention.
Figure 3:
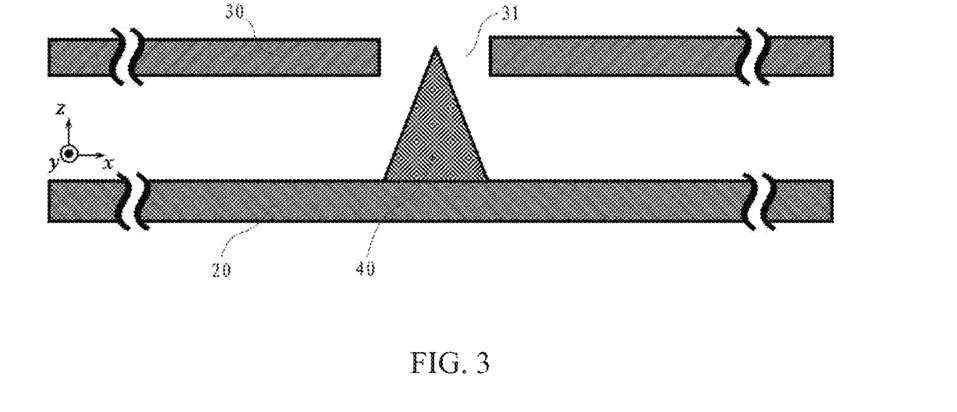
FIG. 3 is a second schematic diagram illustrating cooperation between the variable optical waveplate and the waveguide plate of the MEMS optical microphone in an initial state according to the first embodiment of the present invention.

FIG. 1 is a schematic structural diagram of an MEMS optical microphone in an initial state according to a first embodiment of the present invention. FIG. 2 is a first schematic diagram illustrating cooperation between a variable optical waveplate and a waveguide plate of the MEMS optical microphone in an initial state according to the first embodiment of the present invention. FIG. 3 is a second schematic diagram illustrating cooperation between the variable optical waveplate and the waveguide plate of the MEMS optical microphone in an initial state according to the first embodiment of the present invention. As shown in FIG. 1 to FIG. 3, when there is no sound signal, the membrane 20 and the variable optical waveplate 40 attached to it are in an equilibrium position. The first light path 53 emitted from the electromagnetic radiation source 50 is coupled into the input waveguide 32, and the light from the input waveguide 32 is transmitted through a position close to an apex of the variable optical waveplate 40 that has no or minimum thickness of the birefringent material, such that it does not affect the polarization state of the first light path 53. After passing through such a position at the variable optical waveplate 40, the light is coupled to the output waveguide 33 before it is directed to the sensing part. This means, when no pressure or sound is applied, the input polarization state 70 (e.g., linear polarization state) of the first light path 53 remains unchanged after passing through the variable optical waveplate 40.

Figure 4:
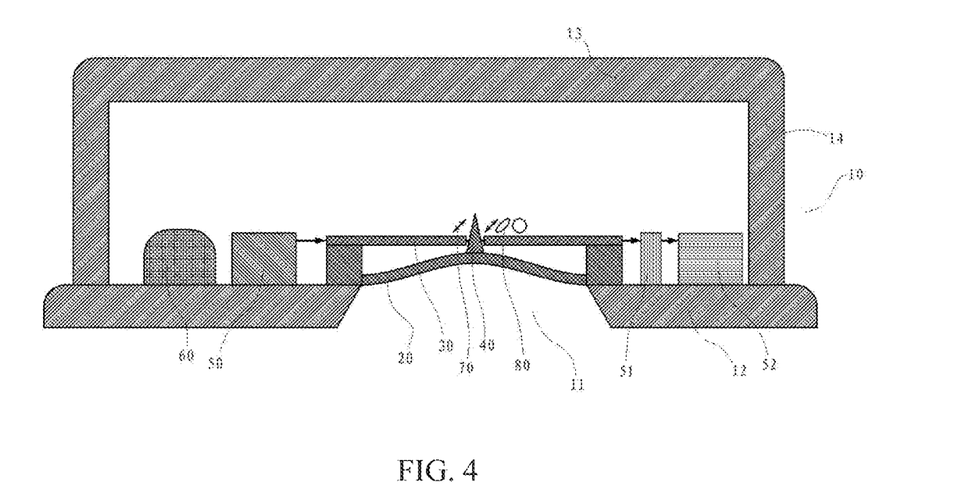
FIG. 4 is a schematic structural diagram of an MEMS optical microphone in an operation state according to the first embodiment of the present invention.
Figure 5:
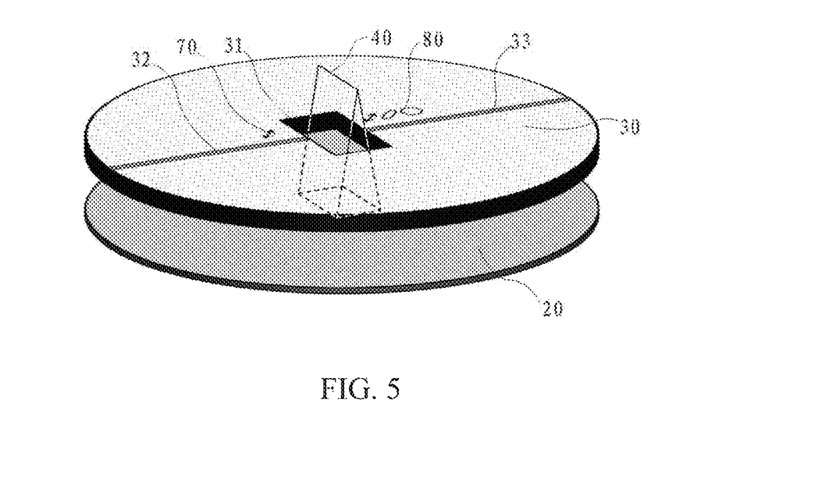
FIG. 5 is a first schematic diagram illustrating cooperation between the variable optical waveplate and the waveguide plate of the MEMS optical microphone in an operation state according to the first embodiment of the present invention.
Figure 6:
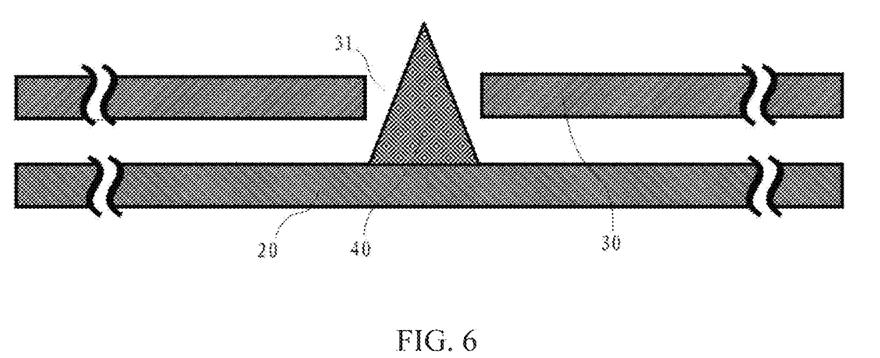
FIG. 6 is a second schematic diagram illustrating cooperation between the variable optical waveplate and the waveguide plate of the MEMS optical microphone in an operation state according to the first embodiment of the present invention.
Figure 7:
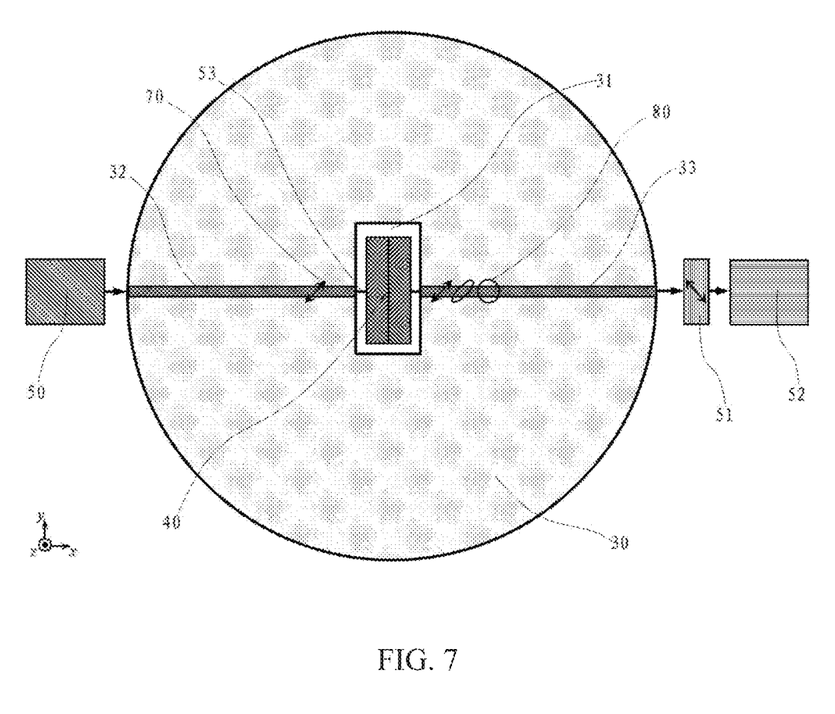
FIG. 7 is a top view of the MEMS optical microphone according to the first embodiment of the present invention.
Figure 13:
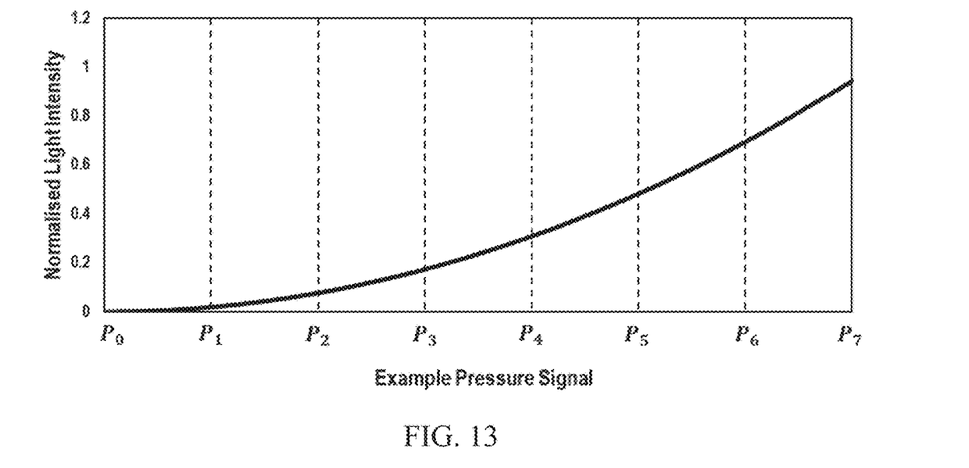
FIG. 13 is a schematic diagram illustrating a corresponding relationship between light intensity and an applied sound or pressure signal according to an embodiment of the present invention.

FIG. 4 is a schematic structural diagram of an MEMS optical microphone in an operation state according to the first embodiment of the present invention. FIG. 5 is a first schematic diagram illustrating cooperation between the variable optical waveplate and the waveguide plate of the MEMS optical microphone in an operation state according to the first embodiment of the present invention. FIG. 6 is a second schematic diagram illustrating cooperation between the variable optical waveplate and the waveguide plate of the MEMS optical microphone in an operation state according to the first embodiment of the present invention. As shown in FIG. 4 to FIG. 6, when a pressure or sound signal is applied to the membrane 20 and causes it to vibrate, the variable optical waveplate 40 attached to the membrane 20 also displaces from its original position. As a result, the first light path 53 from the electromagnetic radiation source 50 is coupled into the input waveguide 32, and the light from the input waveguide 32 is transmitted through a new position at the variable optical waveplate 40. Since the variable optical waveplate 40 has a varying delay, one of the orthogonal components of the light will experience a certain delay after passing through the new position at the variable optical waveplate 40 to cause a delay in its phase, after leaving the variable optical waveplate 40 these components generate a new output polarization state 80. Then, the first light path 53 with the new output polarization state 80 is coupled into the output waveguide 33 and transmitted to the sensing part (polarizer 51 followed by photodiode 52). An optical axis of the polarizer 51 is set with respect to an orientation of the input polarized light, which means that a state of the new output polarization state 80 is detected with a certain level of light intensity at the photodiode 52. FIG. 13 is a schematic diagram illustrating a corresponding relationship between light intensity and an applied sound or pressure signal according to an embodiment of the present invention. With reference to FIG. 13, the stronger the sound or pressure signal applied to the membrane 20, the stronger the detected light intensity of the first light path 53.

In summary, a given sound or pressure signal actuates the membrane 20 and the variable optical waveplate 40. This changes the polarization state of the first light path 53 passing through the variable optical waveplate 40 and generates a configuration of different output polarization states 80 for the given sound signal. A specific state of the output polarization state 80 of the light determines the light intensity. At the photodiode 52, the output polarized light intensity is converted into an electrical signal, which is processed at the IC module 60 and determines the level of the applied pressure or sound signal, so that the level of the applied sound can be determined.

Figure 9:
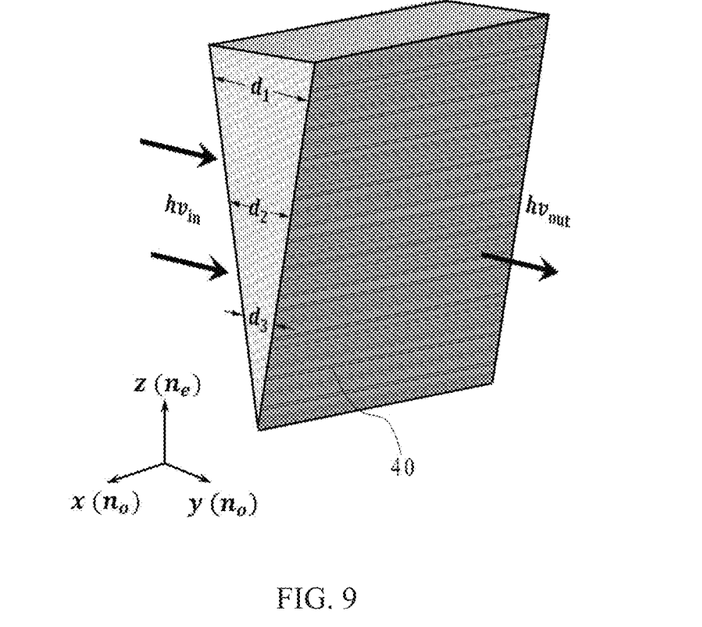
FIG. 9 is an axonometric view of a variable optical waveplate according to an embodiment of the present invention.
Figure 10:
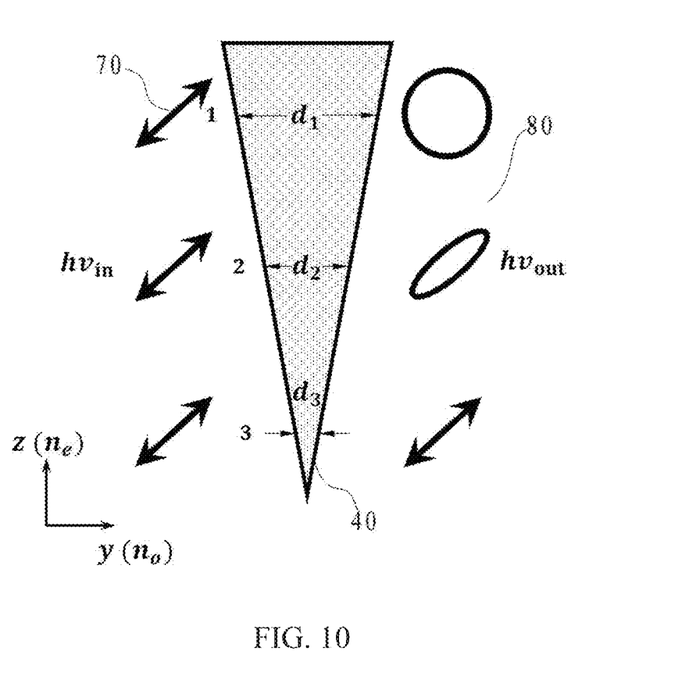
FIG. 10 is a side view of a variable optical waveplate according to an embodiment of the present invention.

In an implementation manner, the variable optical waveplate 40 includes birefringent crystals with different refractive index in different directions, the birefringent crystal has variable thickness, and the change in the thickness of the variable optical waveplate 40 results in a variable delay. A structure of the birefringent crystal is of a wedge shape or a cone shape. FIG. 9 is an axonometric view of a variable optical waveplate according to an embodiment of the present invention. FIG. 10 is a side view of a variable optical waveplate according to an embodiment of the present invention. As shown in FIG. 9 and FIG. 10, a cross section of the variable optical waveplate 40 is a triangular shape structure, for example, the refractive indices of birefringent crystal is $n_x=n_y=n_o$ and $n_z=n_e$, where $n_o$ is the ordinary and $n_e$ is the extra-ordinary refractive index. The triangular shape structure is created to vary the thickness of the optical anisotropic material that has a fixed birefringence ($\Delta n_{fix}=n_e-n_o$; where $n_e>n_o$). The varying thickness of the triangular shape structure at different positions results to variable delay. When the first light path 53 passes through such a structure at a certain position, a certain level of phase delay is added between two orthogonal electric field components of the first light path 53. With reference to FIG. 10, the thicknesses at positions 1, 2, and 3 are $d_1$, $d_2$, $d_3$, respectively, and the resulting phase delays are $\Delta n \times d_1$, $\Delta n \times d_2$, $\Delta n \times d_3$, respectively.

The states of output polarization state 80 include a linear polarization state, an elliptical polarization state and a circular polarization state. It is determined by the delay at the position where the incident light passes through the wedge. With reference to FIG. 10, the linear polarization state corresponds to a position 3, the elliptical polarization state corresponds to a position 2, and the circular polarization state corresponds to a position 1. For example, when the first light path 53 at a linear polarization state falls on the position 1 that has delay, a quarter-waveplate is formed on the position 1 on the optical waveplate 40 and a π/2 phase delay is added between two orthogonal components of the electric field of the first light path 53; therefore, the state of the first light path 53 changes to a circular polarization state after passing through the position 1. Examples on other polarization manipulation such as elliptical or linear at different positions on the wedge are also illustrated in FIG. 10.

When the first light path 53 with certain polarization passes through the polarizer 51, the level of light intensity after passing through the polarizer 51 will vary. The amplitude of the light intensity at a given instance depends on the output polarization state 80 of the first light path 53 as well as the orientation of the optical axis at that instance. For example, if the first light path 53 at a linear polarization state is transmitted through the polarizer 51, the amplitude of the transmitted light intensity varies from maximum to minimum.

Figure 14:
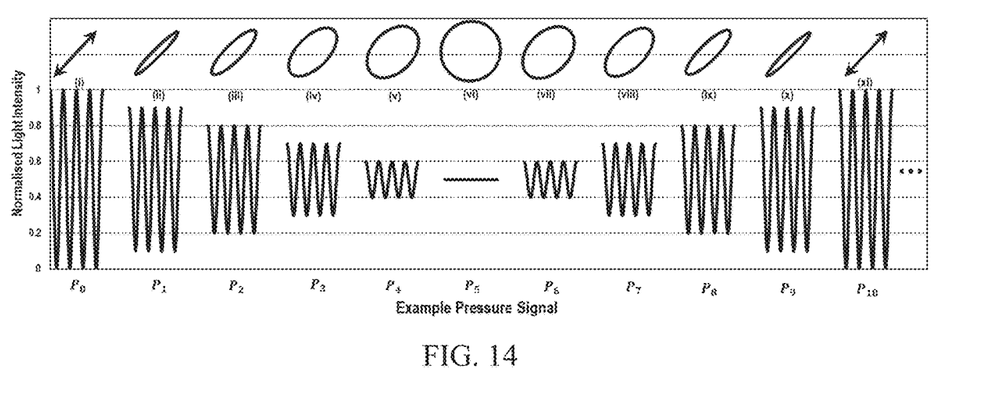
FIG. 14 is a schematic diagram illustrating a corresponding relationship between light intensity and an output polarization state of a first light path according to an embodiment of the present invention.

The present invention will be described by referring to FIG. 10 and FIG. 14 in the following.

(i) At P_0, when the electric field of the first light path 53 at a linear polarization state is oriented along the optical axis of polarizer, it will completely pass through the polarizer and appear as a maximum level of light intensity.

(ii) At P_5, when the orientation of electrical field vector of the electric field of the first light path 53 at a circular polarization state and the optical axis of the rotating polarizer are at a same position, no light will pass through and a minimum or no light intensity is observed.

(iii) For the first light path 53 at an elliptical polarization state at any other positions, the light intensity of the photodiode 52 would vary between maximum and minimum.

For a perfect linear polarization state, the level of modulation is maximum whereas in a perfect circular polarization state, the modulation in light is zero as the electrical field vector of the circular polarized light will always pass through the polarizer 51 as it rotates. For an elliptical polarization state, the modulation intensity of the light would vary from maximum modulation (linear polarization) to zero modulation (circular polarization), the level of modulation would determine ellipticity in the polarization state, this implies a distinct polarization state is generated at a given sound level, which is determined by the level of modulation of in the light intensity signal.

The variable optical waveplate 40 may be birefringent crystal in a wedge shape or pyramid shape that has a variable delay/retardation, and is fixed on the membrane 20. It can also be an in-situ prepared optical anisotropic structure that can create with semiconductor materials such as silicon or its compound so as it offers variable delay/retardation in certain crystallographic directions. Examples of such structures are mesoporous or porous silicon or its compounds formed by etching, photonic crystals such as column or trenches in silicon along certain orientation that alters its effective optical anisotropy along different directions or semiconductor based anisotropic nanowires.

Figure 8:
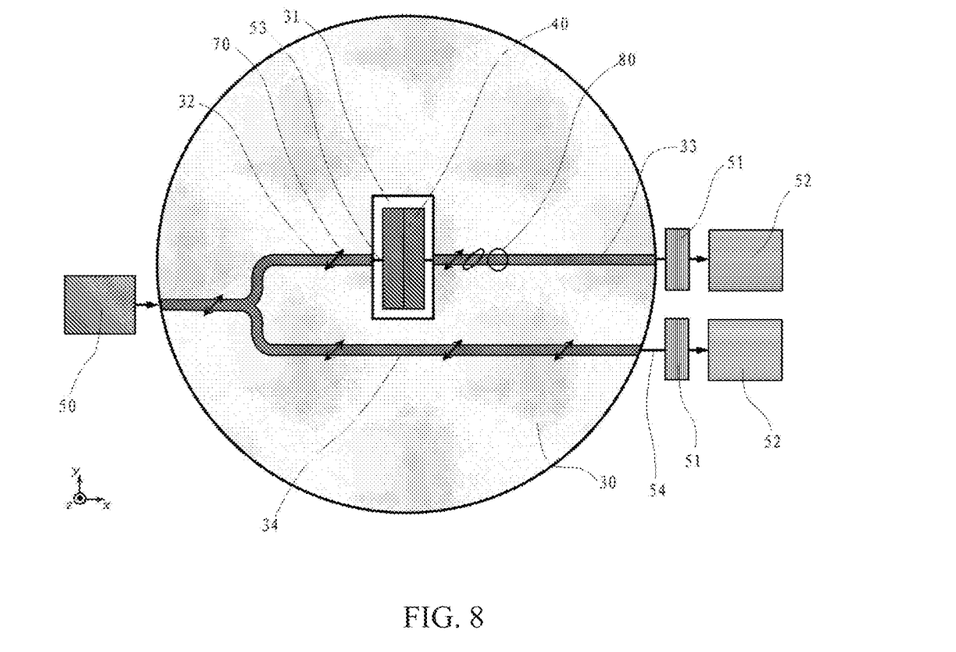
FIG. 8 is a top view of an MEMS optical microphone according to a second embodiment of the present invention.

FIG. 8 is a top view of an MEMS optical microphone according to a second embodiment of the present invention. With reference to FIG. 8, the second embodiment differs from the first embodiment in that a reference guide 34 is provided on the waveguide plate 30, and a second light path 54 emitted from the electromagnetic radiation source 50 enters the sensing part (polarizer 51 followed by photodiode 52) through the reference guide 34. The reference guide 34 serves as a reference and is configured to compare and extract a polarization state of the first light path 53 after passing through the input waveguide 32 and the output waveguide 33. The input waveguide 32 carries the same polarization as the reference guide 34, whereas the output waveguide 33 transmits the first light path 35 when its polarization has changed after traveling through the optical structure.

In an implementation manner, as shown in FIG. 8, only one electromagnetic radiation source 50 is provided, and a beam emitted from the electromagnetic radiation source 50 is divided into a first light path 53 and a second light path 54; and two sensing parts are provided, and each of the first light path 53 and the second light path 54 enters a respective sensing part (polarizer 51 followed by photodiode 52).

In principle, the first light path 53 from a certain input polarization state 70 (e.g., linear polarization state) is delivered into the waveguide plate 30. It then splits into a first light path 53 and a second light path 54 at a junction forming an interferometric arrangement, and the first light path 53 enters the input waveguide 32 and the second light path 54 enters the reference guide 34. Since the waveguide plate 30 is a polarization maintaining waveguide, the polarization state of the light passing through them would not effect, for example, the second light path 54 at a linear polarization state from the electromagnetic radiation source 50 will remain a linear state at the end of the reference guide 34 where it is transported to the photodiode 52 through a polarizer 51. On the other hand, when the first light path 53 at a linear polarization state leaves the input waveguide 32, it passes through the variable optical waveplate 40 and encounters a certain delay/retardation in its phase, and the first light path 53 after leaving the variable optical waveplate 40 would have a different polarization state than the second light path 54; the change in the output polarization state 80 of the first light path 53 would be an elliptical, circular or linear polarization state. The first light path 53 with the new polarization state is directed to the output waveguide 33 and is transported to the photodiode 52 through the polarizer 51 where it is extracted by comparing with the polarization state of the second light path 54.

Figure 12:
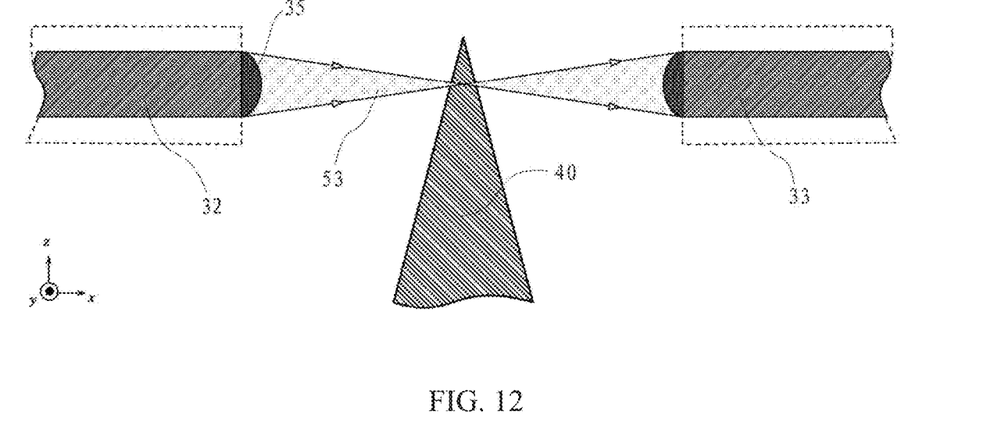
FIG. 12 is a schematic diagram illustrating cooperation between a lens and a waveguide plate according to an embodiment of the present invention.

FIG. 12 is a schematic diagram illustrating cooperation between a lens and a waveguide plate according to an embodiment of the present invention. With reference to FIG. 12, a micro/nano lens 35 is provided at a side of the input waveguide 32 and the output waveguide 33 adjacent to the through-hole 31. The micro/nano lens 35 can allow the light from the input waveguide 32 to be coupled to the variable optical waveplate 40 and the output waveguide 33. The lens 35 focuses the first light path 53 on a small area on the variable optical waveplate 40, and after the first light path 53 passes through the variable optical waveplate 40, it is collected by another lens 35 created on the output waveguide 33. The focal lengths and numerical aperture of the lens 35 are chosen to generate the smallest spot size. The small spot size will allow to focus the light on a smaller region where the effective delay/retardation of the birefringent material remains unchanged so that it can correctly manipulate the input polarization state 70 to the other output polarization state 80 as the applied sound level varies.

Figure 11:
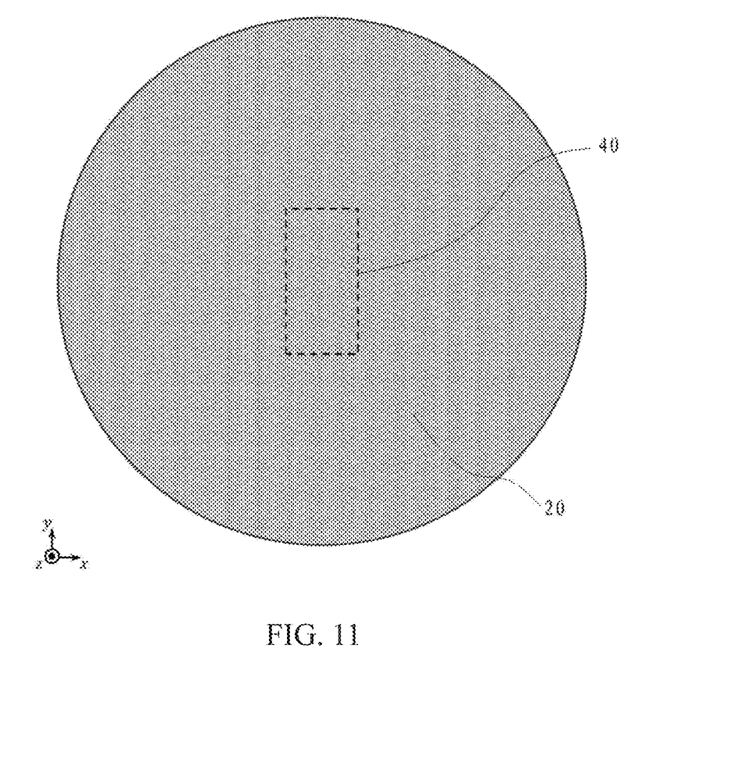
FIG. 11 is a top view of a membrane according to an embodiment of the present invention.

FIG. 11 is a top view of a membrane according to an embodiment of the present invention. With reference to FIG. 11, the membrane 20 is a micro-machined thin film, diaphragm or membrane made with silicon or its compound, and the membrane 20 can be made of a single material or multiple materials. It can be single crystal silicon, silicon nitride, silicon oxide, polysilicon, polyimide or a combination thereof. The membrane 20 have a shape that is a central symmetrical graphic, which is not limited to a circular shape and can also be a square, etc.

The variable optical waveplate 40 is arranged at a geometric center of the membrane 20, and the amplitude is the largest at the center of the membrane 20, and even a slight vibration can cause displacement of the variable optical waveplate 40, thereby improving the sensing accuracy.

The above-described embodiments are merely preferred embodiments of the present invention and are not intended to limit the present invention. Various changes and modifications can be made to the present invention by those skilled in the art. Any modifications, equivalent substitutions and improvements made within the principle of the present invention shall fall into the protection scope of the present invention.

What is claimed is:

1. An MEMS optical microphone, comprising:
    a case comprising a cavity and a sound inlet that communicates the cavity to outside;
    a membrane suspended in the cavity and closes the sound inlet;
    a waveguide plate suspended in the cavity and located at a side of the membrane away from the sound inlet, wherein a through-hole passes through the waveguide plate, and an input waveguide and an output waveguide are provided at two opposite sides of the through-hole, respectively;
    a variable optical waveplate provided between the membrane and the waveguide plate, wherein the variable optical waveplate comprises a first end connected to a surface of the membrane facing away from the sound inlet, and a second end extends into the through-hole; and
    the variable optical waveplate moves back and forth along a first direction along as the membrane vibrates and deforms;
    an optoelectronic module comprising an electromagnetic radiation source and a sensing part that are provided at two opposite sides of the waveguide plate, respectively, wherein a first light path emitted from the electromagnetic radiation source is coupled into the waveguide plate; the first light path enters the sensing part after sequentially passing through the input waveguide, the variable optical waveplate and the output waveguide; and the variable optical waveplate is configured to convert an input polarization state of the first light path into an output polarization state, which varies as a moving distance of the variable optical waveplate along the first direction; and
    an IC module electrically connected to the membrane and the optoelectronic module;
    wherein a reference guide is provided on the waveguide plate, and a second light path emitted from the electromagnetic radiation source enters the sensing part through the reference guide.

2. The MEMS optical microphone as described in claim 1, wherein the variable optical waveplate comprises a birefringent crystal with different refractive indices in different directions.

3. The MEMS optical microphone as described in claim 2, wherein a structure of the birefringent crystal is of a wedge shape or a cone shape.

4. The MEMS optical microphone as described in claim 2, wherein the birefringent crystal comprises mesoporous or porous silicon or a compound thereof formed by etching.

5. The MEMS optical microphone as described in claim 1, wherein the output polarization state is one of a linear polarization state, an elliptical polarization state or a circular polarization state.

6. The MEMS optical microphone as described in claim 1, wherein a beam emitted from the electromagnetic radiation source is divided into the first light path and the second light path, two sensing parts are provided, and the first light path and the second light path enter the two sensing parts, respectively.

7. The MEMS optical microphone as described in claim 1, wherein the sensing part comprises a polarizer and a photodiode, and the photodiode is located at a side of the polarizer away from the electromagnetic radiation source.

8. The MEMS optical microphone as described in claim 1, wherein a lens is provided at a side of the input waveguide adjacent to the through-hole, and another lens is provided at a side of the output waveguide adjacent to the through-hole.

9. The MEMS optical microphone as described in claim 1, wherein the membrane is of a shape that is a central symmetrical graphic, and the waveguide plate is arranged at a geometric center of the membrane.

* * * * *